United States Patent [19]

Maly et al.

[11] Patent Number: 5,051,690
[45] Date of Patent: * Sep. 24, 1991

[54] APPARATUS AND METHOD FOR DETECTING VERTICALLY PROPAGATED DEFECTS IN INTEGRATED CIRCUITS

[75] Inventors: Wojciech Maly, Pittsburgh, Pa.; Michael E. Thomas, Milpitas, Calif.

[73] Assignee: National Semiconductor Corporation, Santa Clara, Calif.

[ * ] Notice: The portion of the term of this patent subsequent to May 30, 2006 has been disclaimed.

[21] Appl. No.: 357,546

[22] Filed: May 26, 1989

Related U.S. Application Data

[63] Continuation-in-part of Ser. No. 11,729, Feb. 6, 1987, Pat. No. 4,835,466.

[51] Int. Cl.$^5$ ............................................. G01R 31/02
[52] U.S. Cl. ............................ 324/158 R; 324/158 T; 437/8
[58] Field of Search ........... 324/152 R, 152 D, 152 T, 324/715, 718; 437/8

[56] References Cited

U.S. PATENT DOCUMENTS

| | | | |
|---|---|---|---|
| 4,144,493 | 3/1979 | Lee et al. | 324/158 R |
| 4,386,459 | 6/1983 | Boulin | 324/158 R |
| 4,516,071 | 5/1985 | Buehler | 324/158 R |
| 4,542,340 | 9/1985 | Chakrowarti et al. | 324/158 T |
| 4,835,466 | 5/1989 | Maly et al. | 324/158 R |

Primary Examiner—Kenneth A. Wieder
Assistant Examiner—William J. Burns
Attorney, Agent, or Firm—Lee Patch; Michael A. Glenn; William H. Murray

[57] ABSTRACT

Vertically propagated defects in integrated circuits are detected utilizing an apparatus which includes a first meander structure formed on or in a substrate and a second meander structure electrically insulated from the first meander. Each meander includes intermediate segments, the ends of which are interconnected by folded segments. A first set metal of strips are electrically insulated from the first and second meanders. The ends of each strip in the first set are electrically connected to the ends of a corresponding intermediate segment of the first meander. A second set metal or strips are electrically insulated from the first set of strips, the first meander and the second meander. The ends of each strip in the second set are electrically connected to the ends of a corresponding intermediate segment of the second meander and at least a portion of the second set of strips overlies at least a portion of the first set of strips.

22 Claims, 10 Drawing Sheets

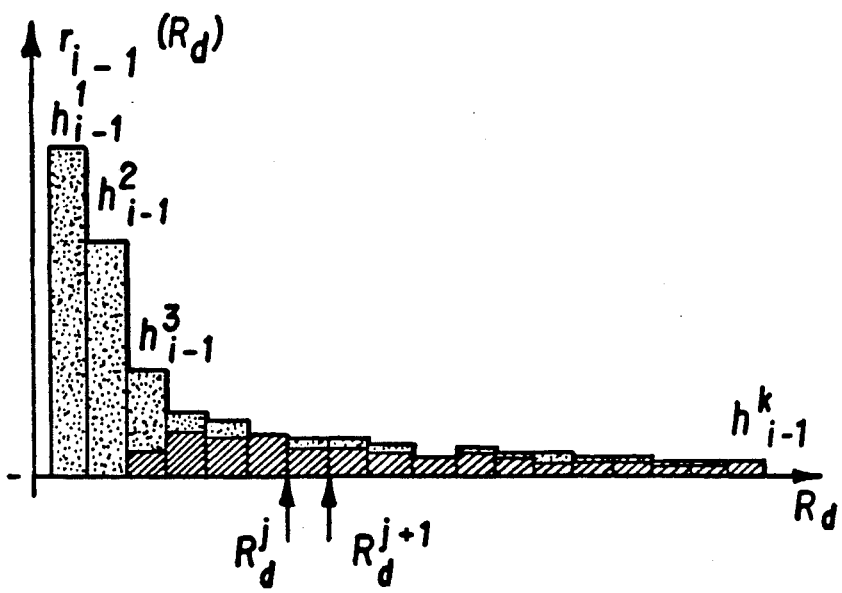
FIG. 11A
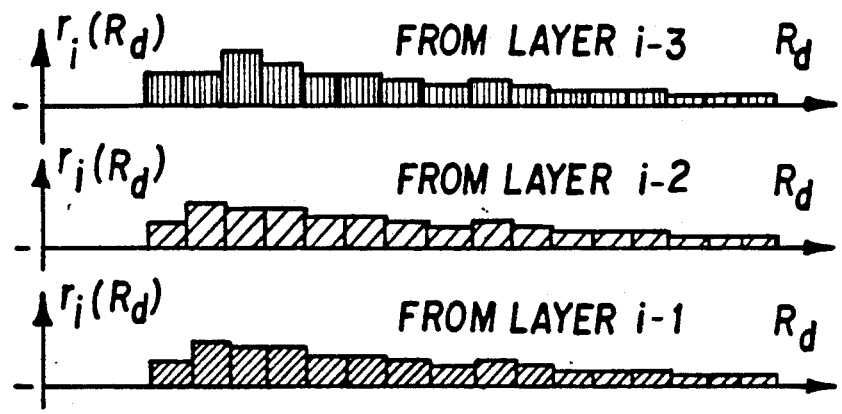
FIG. 11B
FIG. 11C
FIG. 11D
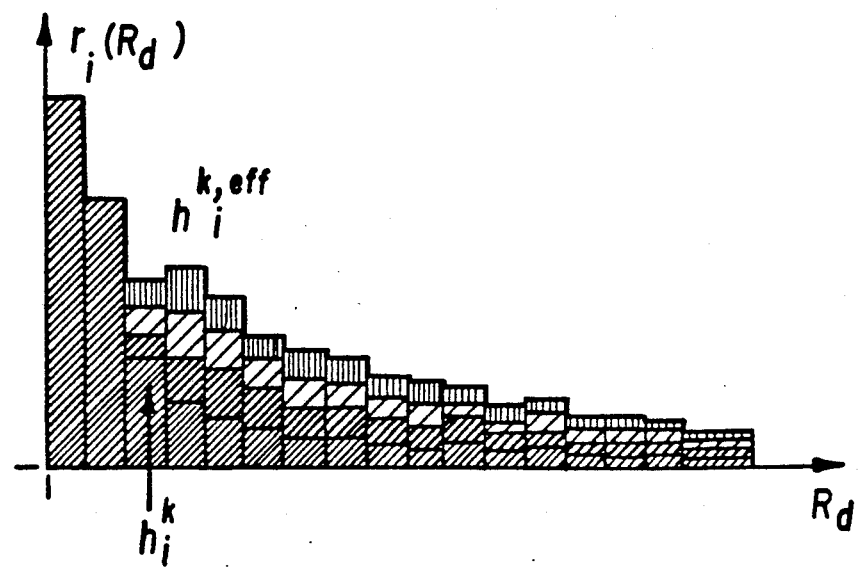
FIG. 11E

APPARATUS AND METHOD FOR DETECTING VERTICALLY PROPAGATED DEFECTS IN INTEGRATED CIRCUITS

CROSS REFERENCE TO RELATED APPLICATION

This application is a continuation-in-part of application Ser. No. 011,729, filed Feb. 6, 1987, now U.S. Pat. No. 4,835,466.

BACKGROUND OF THE INVENTION

The present invention pertains to apparatus for use in manufacturing integrated circuits and more particularly to apparatus and methods for detecting defects in such circuits.

Yield prediction and yield estimation are very important considerations in integrated circuit design and process development. Modeling of spot defect related yield losses has been investigated in order to improve yield prediction and estimation, and various yield models have been proposed as a result. However, most of these models assume that any spot defects on the surface of integrated circuit die causes functional failure. Such an assumption is inaccurate and is especially misleading in the case of very large scale integrated circuits where spot defects observed on the surface of an integrated circuit do not necessarily cause functional failures.

For example, small defects may cause deformation of the circuit connectors when such defects occur in a congested region of the integrated circuit surface. However, they do not affect the performance of the circuit when they are located in other, less dense regions of the same integrated circuit. Thus, models that do not take into account realistic relationship between defect size and defect location with respect to the detail of integrated circuit layout, are faulty.

Our co-pending U.S. Patent Application Ser. No. 011,729, filed Feb. 6, 1987, entitled "Apparatus and Method For Detecting Spot Defects In Integrated Circuits", the parent of the present continuation-in-part application, describes and claims a method and apparatus for accurately determining the size distribution and density of defects in integrated circuits. The method and apparatus also determines the type of spot defect, whether as open or a short, in a metal layer of an integrated circuit. Although the method and apparatus set forth in our aforementioned co-pending application represents a significant improvement in the determination of the defect size distribution associated with interconnect processing, it does not provide information concerning the fraction of interconnect failures which are generated by vertically propagating defects. Such information is necessary in order to provide a complete yield analysis.

SUMMARY OF THE INVENTION

It is therefore an object of the present invention to provide a method and apparatus for detecting defects in integrated circuits.

It is another object of the present invention to provide a method and apparatus for detecting vertically projecting defects.

It is a further object of the present invention to provide a method and apparatus for distinguishing vertical defects from planar defects.

It is still another object of the present invention to provide a method and apparatus which is readily integrated into the real process flow of standard MOS or BICMOS technology.

These and other objects which will become apparent and are achieved in accordance with the present invention are accomplished by producing a first meander of high electrical resistivity material in or on a single crystal silicon substrate. The first meander includes a predetermined number of intermediate segments, the ends of which are interconnected by folded segments such that an electrical circuit, having an electrical resistance $R_1$, is formed between the ends of the meander. The first meander is produced, for example, by forming an implant mask on a surface of a substrate comprising single crystal silicon. The meander pattern is formed in the implant mask which is used to dope the underlying single crystal silicon in the predetermined meander pattern by ion implantation. The doped meander pattern has a resistivity which is substantially lower than that of the remaining single crystal silicon.

A first layer of electrically insulating material, such as silicon dioxide is formed over the surface of the single crystal silicon substrate. A polysilicon layer is then formed over the first insulating layer. The polysilicon layer is doped, preferably in sheet form by ion implantation, and subsequently heated to activate the implanted region. The doped polysilicon layer is then patterned into a second meander which includes a predetermined number of intermediate segments, the ends of which are interconnected by folded segments. The interconnected intermediate and folded segments of the second meander form an electrical circuit having an electrical resistance $R_2$ between the ends thereof. In a preferred embodiment, the intermediate segments of the second meander overlie and are substantially orthogonal to the intermediate segments of the first meander.

A second layer of electrically insulating material is then formed over the second meander and planarized. Contact holes are then defined and etched through the second and first insulating layers to expose predetermined portions of the first meander. A first layer of electrically conductive material such as a metal, is then deposited over the planarized second layer of insulating material into the contact holes thus making electrical contact with the predetermined exposed regions of the first meander. The first electrically conductive layer is then patterned and etched into a first set of strips, each of which electrically shorts out a corresponding intermediate segment of the first meander by providing a direct electrical connection between the ends thereof. In a preferred embodiment, each strip is positioned in substantial alignment with the corresponding intermediate segment of the first meander. The first meander and the first set of electrically conductive strips which are electrically connected thereto define a first test structure. This first test structure is substantially equivalent to the bridge structure in the parent application Ser. No. 011,729.

A third layer of electrically insulating material is then formed over the first electrically conductive strips and planarized. Contact holes are then defined and etched through the third and second insulating layers to expose predetermined regions of the underlying polysilicon second meander. A second layer of electrically conductive material, such as a metal, is then formed over the third insulating layer into the contact holes thus making contact with the predetermined exposed regions of the underlying second polysilicon meander. The second electrically conductive layer is then patterned and etched into a second set of strips, each of which electrically shorts out the corresponding intermediate segment of the second meander by providing a direct electrical connection between the ends thereof. The second set of electrically conductive strips are oriented such that at least portion of the second set overlies at least a portion of the first set of electrically conductive strips.

In a preferred embodiment, each of the second electrically conductive strips is positioned in substantial alignment with the corresponding intermediate segment of the second meander. The second meander and the second set of electrically conductive strips which are electrically connected thereto define a second test structure. This second test structure is substantially the same as the structure in the parent application except that there is at least a portion of a first set of electrically conductive strips underlying and electrically insulated from the second set of electrically conductive strips. The resultant structure, comprising first and second test structures in which at least a portion of the set of electrically conductive strips of the second test structure overlies and is electrically insulated from at least a portion of the set of electrically conductive strips of the first test structure is herein defined as a test pair.

A plurality of test pairs are distributed over the surface of a test wafer which undergoes the same processing as production wafers. The distribution of test pairs over a test wafer enables the measurement of the density distribution of shorts or breaks in the metallization corresponding to the metallization from which the first electrically conductive strips are formed; as well as in the metallization corresponding to metallization from which the second electrically conductive strips are formed. The test pairs also enable the determination of which defects are planar and which are vertical. This is accomplished by detecting defects in the first test structure and detecting defects in the second test structures in accordance with the procedure set forth in the parent application, Ser. No. 011,729, which application is incorporated by reference as if fully set forth herein. If a defect is detected within only one of the test structures of a test pair, it is a planar defect associated only with the processing of that level of the integrated circuit corresponding to the level of the test structure in which the defect was detected. Vertical defects which are present are identified by locating planar defects in both of the test structures of a test pair. Since the possibility is low of having more than one defect in a single test structure or one planar defect within each test structure of a test pair, it can be statistically inferred with high probability that the defect is common to both test structures in the test pair and is therefore vertical in nature.

BRIEF DESCRIPTION OF THE DRAWINGS

FIG. 11A-11E depict five histograms plotting the frequency of spot defects occurring in a layer i of an exemplary semiconductor structure versus the diameter of the defect.

DETAILED DESCRIPTION OF THE PREFERRED EMBODIMENT

Figure 1A:
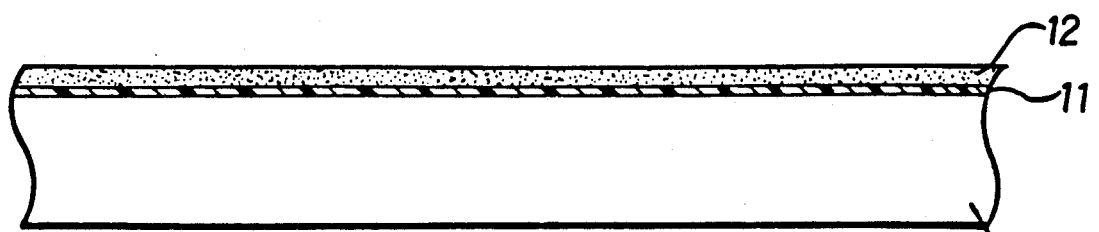
FIG. 1A through FIG. 1H are diagrammatic cross-sectional representations of various processing steps performed to produce a preferred embodiment of the test structure in accordance with the present invention.

Referring to FIG. 1A, a screen oxide layer 11 is formed on a surface of a substrate 10 of a single crystal silicon material. The screen oxide layer 11 is preferably silicon dioxide which is thermally grown to a thickness of approximately 500-1000 Å. A layer 12 of photoresist material is formed over the screen oxide layer 11. The photoresist layer 12 is formed into a predetermined meander pattern using photolithography techniques known in the art. The patterned photoresist layer 12 forms a mask for doping the underlying single crystal silicon substrate. The single crystal silicon substrate 10 is then doped in the predetermined meander pattern in order to form a first meander represented by reference numeral 14 in FIG. 1B, and preferably in the shape depicted in FIG. 2, by ion implantation techniques which are known in the art. It should be noted that the first meander 14 could also be formed by other techniques such as patterning a layer of polysilicon which has been formed over and is insulated from the silicon substrate; and such techniques are considered to be within the scope of the present invention.

Figure 1B:
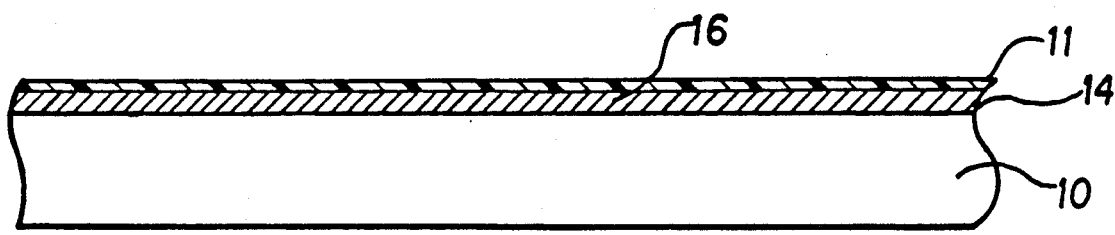
Figure 2:
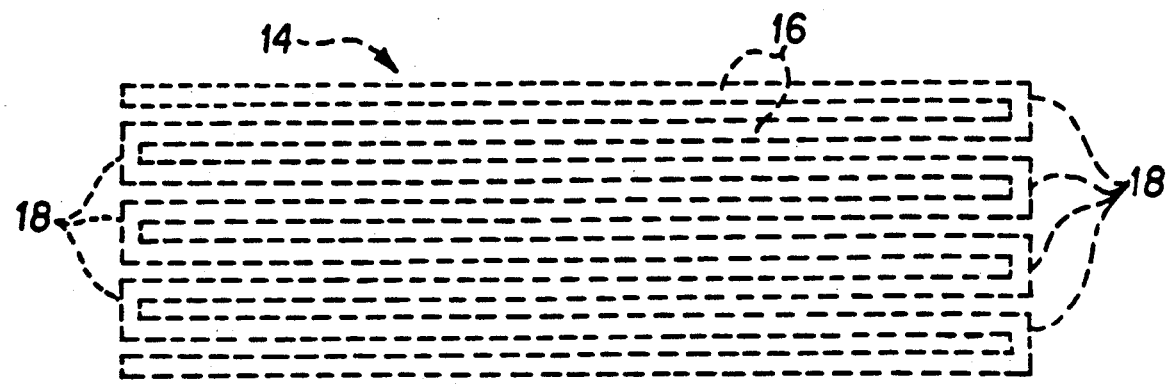
FIG. 2 a diagrammatic representation of the plan view of a first meander formed in a substrate of single crystal silicon in with the present invention.

After doping, the photoresist layer 12 is removed as shown in FIG. 1B. As shown in FIG. 2, the meander pattern 14 comprises a plurality of intermediate segments 16 which are interconnected by folded segments 18. The interconnected intermediate and folded segments, 16 and 18, form a low electrical conductivity path having an electrical resistance which is substantially less than the resistance of the surrounding single crystal silicon. The intermediate segments 16 are preferably in the form of substantially straight lines; however, other patterns such as saw-tooth or sinusoidal forms are usable and are considered to be within the scope of the present invention.

Figure 1C:
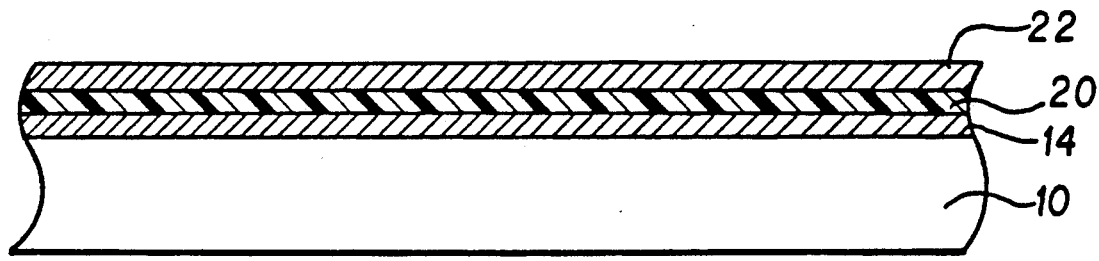
Figure 1D:
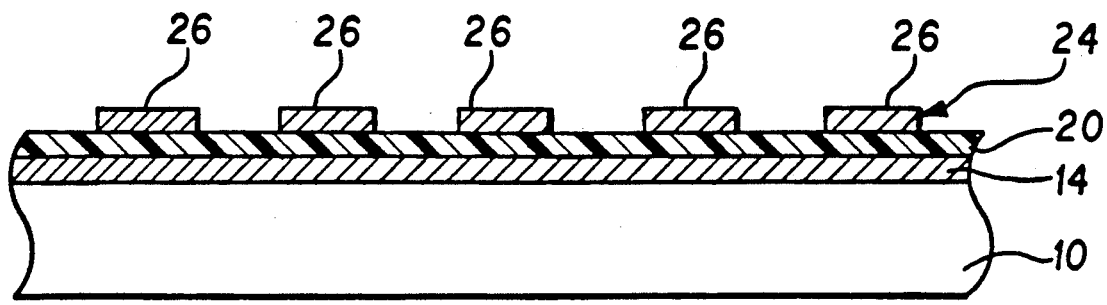

Referring back to FIG. 1C, a first layer 20 of dielectric material is formed over the surface of the single crystal substrate 10 and the implanted first meander 14. In the preferred embodiment, the first dielectric layer 20 is a bi-layer which comprises a first layer of silicon dioxide thermally grown to a thickness of approximately 1000Å. A second layer of silicon dioxide is then deposited over the first layer to a thickness of approximately 3000Å using low pressure chemical vapor deposition (LPCVD) techniques known in the art. A layer 22 of polysilicon is then formed over the first dielectric layer 20. The polysilicon layer 24 is doped by, for example, ion implantation over the entire layer. The implantation is activated by heating as is known in the art. Thus treated, the polysilicon layer 22 has a predetermined electrical resistance.

The polysilicon layer 22 is then formed into a second meander 24 (see FIG. 3) by photolithography and etching techniques which are known in the art. The second meander 24 comprises a plurality of intermediate segments 26, the ends of which are interconnected by folded segments 28. The interconnected intermediate and folded segments, 26 and 28, form a low electrical conductivity path. The intermediate segments 26 of the second meander 24 are preferably positioned in substantially orthogonal relationship with the intermediate segments 16 of the underlying first meander 14 as diagrammatically depicted in FIG. 3. However, it is not necessary to have any predetermined positional relationship between the first and second meanders in order to practice the present invention.

Figure 1E:
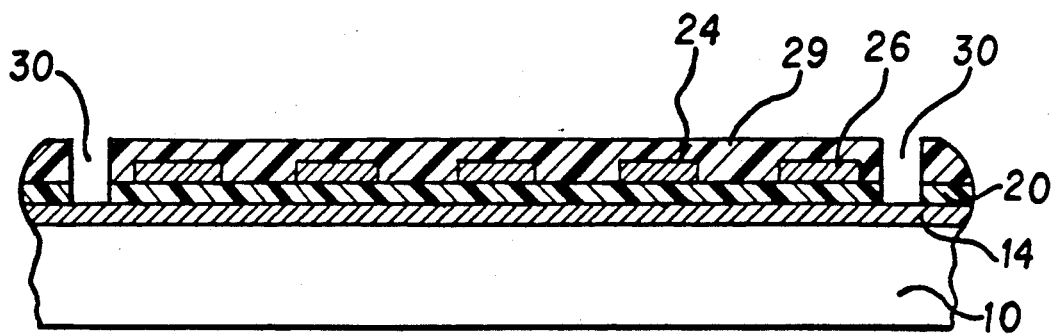
Figure 3:
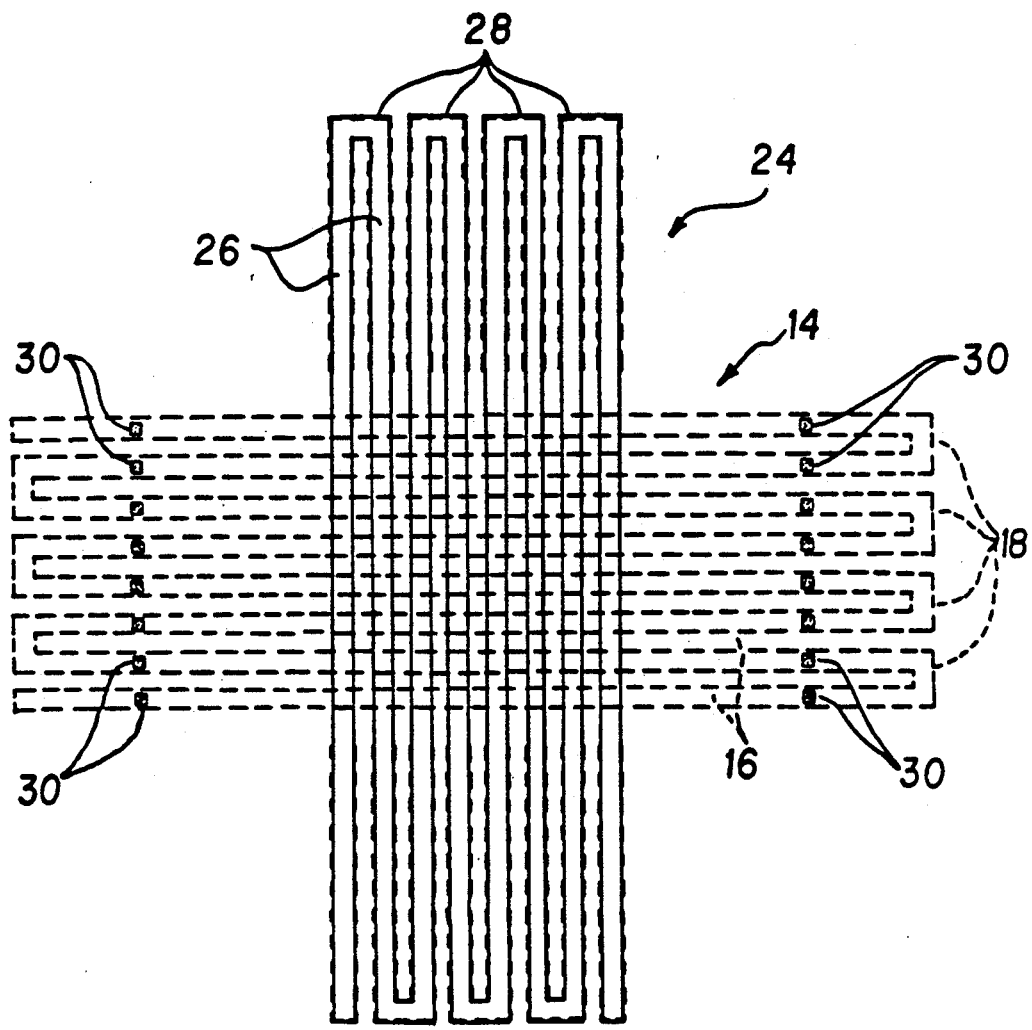
FIG. 3 is a diagrammatic plan view of a second meander orthogonally rotated with respect to the meander depicted in FIG. 2 in accordance with the present invention.

Referring now to FIG. 1E, a second layer 29 of dielectric material is formed over the second meander 24 then planarized. In the preferred embodiment, the second dielectric layer 29 is silicon dioxide which is deposited to a thickness of approximately 7,000 Å using LPCVD techniques known in the art. Contact holes 30 are etched through second dielectric layer 29 and first dielectric layer 20 to expose predetermined regions in the underlying first meander 14. These regions are located proximate to the ends of the intermediate segments 16 of the first meander 14. The preferred relationship of the contact holes 30 with respect to the intermediate segments 16 and folded 1B segments of the first meander 14 are shown in FIG. 3.

Figure 1F:
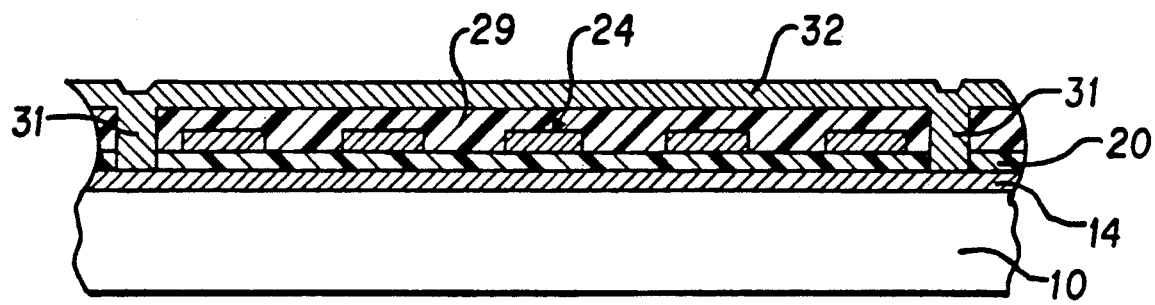

Referring to FIG. 1F, a first layer 32 of high electrical conductivity material is deposited over the second dielectric layer 29 into the contact holes 30 thereby forming vias 31 which make electrical contact with the underlying first meander 14 at the predetermined regions exposed by the contact holes 30. In the preferred embodiment, the first high electrical conductivity layer 32 comprises a metal such as aluminum. High electrical conductivity (low resistivity) and low electrical conductivity (high resistivity) are terms which, in the description of the present invention, are related to each other such that the high conductivity material has an electrical conductivity which is at least one order of magnitude times the electrical conductivity of the low conductively material. In the preferred embodiment, the electrical conductivity of the high electrical conductivity material is approximately 5,000 times the electrical conductivity of the low electrical conductivity material.

Figure 4:
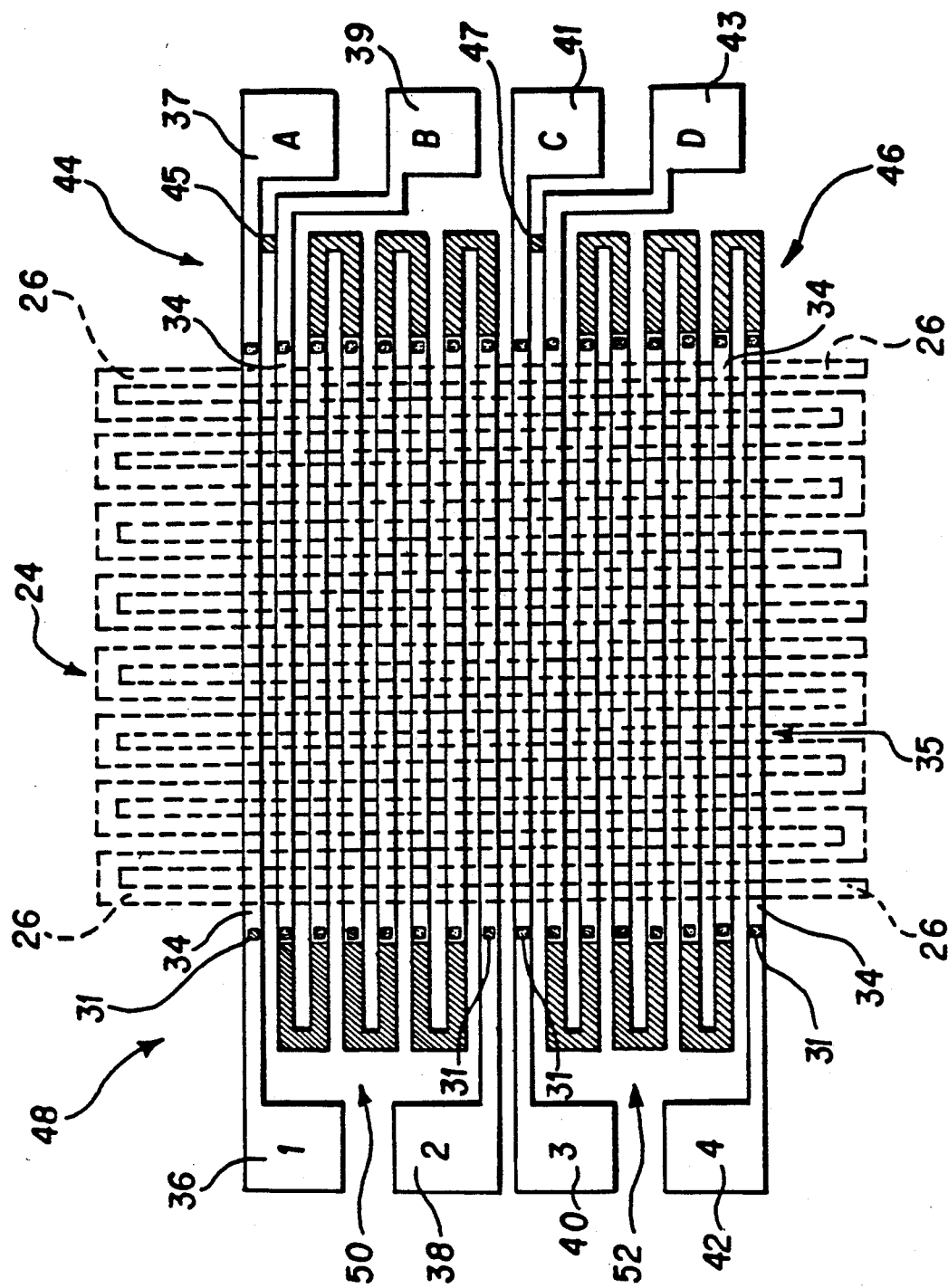
FIG. 4 is a diagrammatic plan view of a patterned first electrically conductive layer depicting its position with respect to the underlying first and second meanders.

The first high conductivity layer 32 is then patterned and etched into a plurality of strips 34 (as shown in FIG. 4) forming a first set of strips 35. Each strip 34 preferably is positioned in substantially coincident overlying spaced relationship with respect to a corresponding underlying intermediate segment 16 and has a width and length which is substantially equal to the width and length respectively of the corresponding underlying intermediate segment. It should be noted that although preferred, such spacial alignment and dimensional equivalence between the strips 34 and the corresponding intermediate segments 16 are not required to practice the present invention as long as each electrically conductive strip 34 is electrically connected between the ends of a corresponding intermediate segment 16.

The ends of each strip 34 are electrically connected to its corresponding underlying intermediate segment 16 of the first meander 14 by means of the vias 31 in the contact holes 30 which are formed through the insulating layers 29 and 20. Accordingly each electrically conductive strip 34 is electrically connected between the ends of the corresponding underlying intermediate segment 16.

First, second, third and fourth end contact terminals, 36, 38, 40 and 42 respectively, and first, second, third and fourth intermediate contact terminals, 37, 39, 41 and 43 respectively, are formed in the first high electrical conductivity layer 32 as shown in FIG. 4. Although four end contact terminals and four intermediate contact terminals are utilized for purposes of this detailed description, additional end and intermediate contact terminals could be utilized depending upon the number and size of the meanders as well as the number of sections into which the test structures are divided. Such alternate configurations including additional contact terminals are considered within the scope and contemplation of the present invention.

The first end contact terminal 36 is electrically connected to a via 31 at one end of a first section 44 of the first meander 14. The second end contact terminal 38 is electrically connected to a via 31 at the other end of the first section 44 of the first meander 14. The third end contact terminal 40 is electrically connected to a via 31 at one end of a second section 46 of the first meander 14; and the fourth end contact terminal 42 is electrically connected to a via 31 at the second end of the second section 46 of the first meander 14. The first meander 14 and the overlying metal strips 34, which are electrically insulated from the underlying first meander 14, form a first test structure 48 which comprises a first section 50 electrically connected between the first 36 and second 38 end contact terminals, and a second section 52 electrically connected between the third 40 and fourth 42 end contact terminals. The first 3 and second 39 intermediate contact terminals are electrically connected to the ends of a first folded segment 45 (portions of which are obscured by the electrical connection leads of intermediate contact terminals 37 and 39 in the view depicted in FIG. 4) of the first section 50 of the first test structure 48. The third 41 and fourth 43 intermediate contact terminals are electrically connected to the ends of a first folded segment 47 (portions of which are obscured by the electrical connection leads of intermediate contact terminals 37 and 39 in the view depicted in FIG. 4) of the second section 52 of the first test structure 48.

As can be seen from FIGS. 1F and FIG. 4, the first test structure 48 is similar to the test structure set forth in the parent application. The entire contents of the parent U.S. Patent Application Ser. No. 011,729, filed Feb. 6, 1987 is incorporated by reference in the present application as if fully set forth herein. A significant difference between the two test structures is that a plurality of orthogonally positioned intermediate segments 26 of the second meander 24 are disposed between the underlying meander 14 in the single crystal silicon substrate 10 and the overlying metal strips 34 of the preferred embodiment of the present invention as depicted in FIG. 4.

Figure 1G:
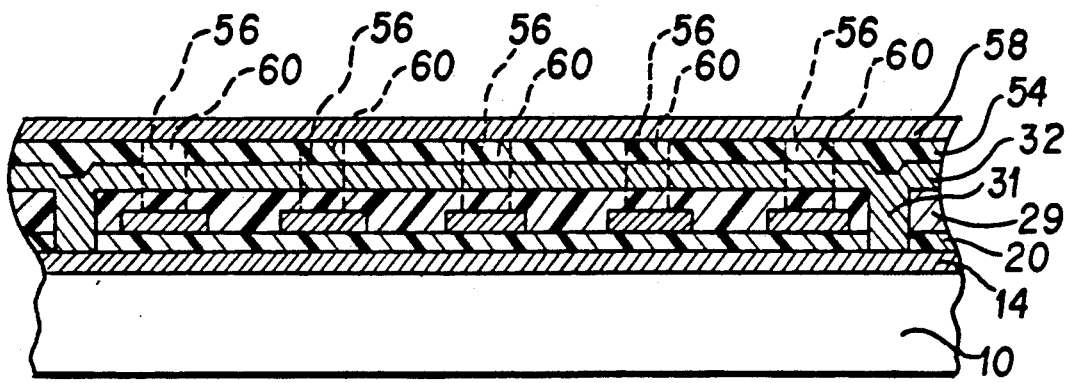
Figure 5:
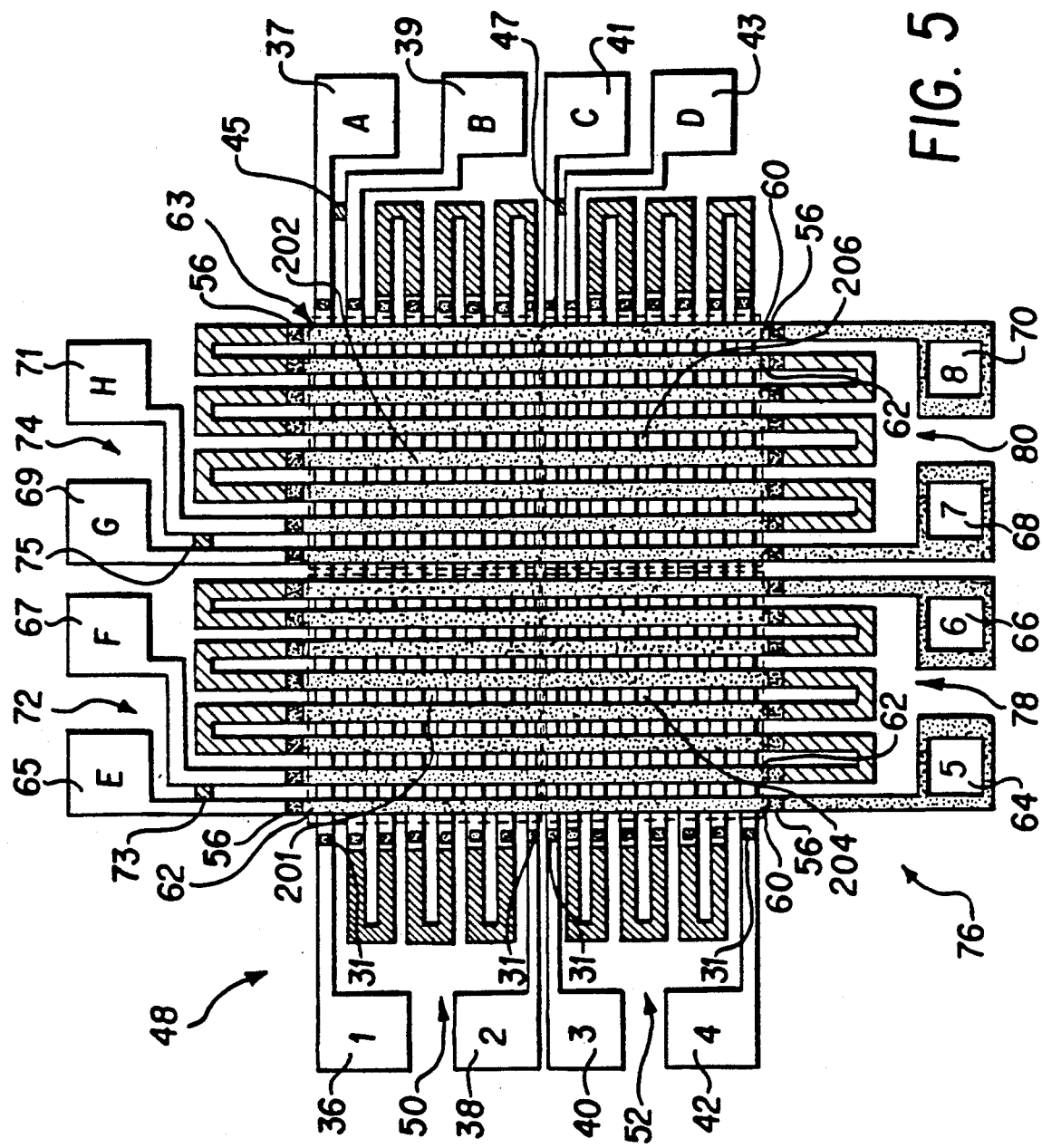
FIG 5 is a diagrammatic plan view of a second patterned electrically conductive layer depicting its position with respect to the underlying first and second meanders and the first patterned electrically conductive layer.

Referring now to FIG. 1G, a third layer 54 of dielectric material is formed over the metal strips 34 and then planarized. In the preferred embodiment, the third dielectric layer 54 is silicon dioxide which is thermally grown to a thickness of approximately 7,000 Å. Contact holes 56 are etched through the third dielectric layer 54 and the second dielectric layer 29 to expose predetermined regions in the underlying second meander 24. The regions are located proximate to the ends of the intermediate segments 26 of the second meander 29. The preferred relationship of the contact holes 56 with respect to the intermediate segments 26 and folded segments 28 of the second meander 24 are shown in FIG. 5. It should be noted that the contact holes 56 are preferably formed outside of the first test structure 48 and therefore do not expose any sections of the first test structure 48.

A second layer 58 of high electrical conductivity material is deposited over the third dielectric layer 54 into the contact holes 56 thereby forming vias 60 which make electrical contact with the underlying second meander 24 at the predetermined regions exposed by the contact holes 56. In the preferred embodiment, the second high electrical conductivity layer 58 comprises a metal such as aluminum.

Figure 1H:
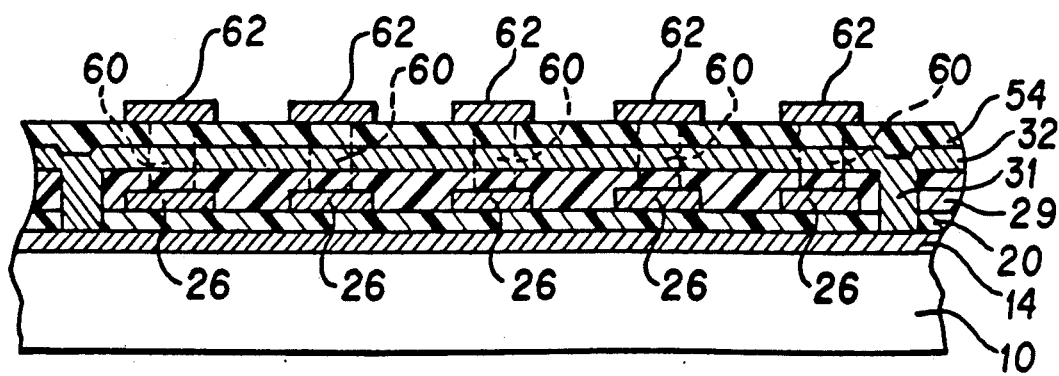

The second high conductivity layer 58 is then patterned into a plurality of strips 62 (see FIG. 1H and FIG. 5) forming a second set of strips 63. Each strip 62 preferably is positioned in substantially coincident overlying spaced relationship with respect to a corresponding underlying intermediate segment 26 and has a width and a length which is substantially equal to the width and length respectively of the underlying intermediate segment 26. Although preferred, such spacial alignment and dimensional equivalence between the strips 62 and the intermediate segments 26 are not required to practice the present invention as long as each electrically conductive strip 62 is electrically connected between the ends of a corresponding intermediate segment 26. However, it is necessary that at least a portion of the second set of strips 63 overlie at least a portion of the first set of strips 35.

The ends of each strip 62 are electrically connected to the ends of its corresponding underlying intermediate segment 26 of the second meander 24 by means of the vias 60 in the contact holes 56 which were formed through the third 54 and the second 29 dielectric layers. Accordingly each electrically conductive strip 62 is electrically connected between the ends of the corresponding underlying intermediate segment 26. Fifth, sixth, seventh and eighth end contact terminals, 64, 66, 68 and 70 respectively, and fifth, sixth, seventh and eighth intermediate contact terminals, 65, 67, 69 and 71 respectively, are formed in the second high electrical conductivity layer 58 as shown in FIG. 5. Although four end contact terminals and four intermediate contact terminals are utilized for purposes of this detailed description, additional end and intermediate contact terminals could be utilized depending upon the number and size of the meanders as well as the number of sections into which the test structures are divided. Such alternate configurations including additional contact terminals are considered within the scope and contemplation of the present invention.

The fifth end contact terminal 64 is electrically connected to a via 60 at one end of a first section 72 of the second meander 24. The sixth end contact terminal 66 is electrically connected to a via 60 at the other end of the first section 72 of the second meander 24. The seventh end contact terminal 68 is electrically connected to a via 60 at one end of a second section 74 of the second meander 24, and the eighth end contact terminal 70 is electrically connected to a via 60 at the other end of the second section 74 of the second meander 24. The second meander 24 and the overlying metal strips 62, which are electrically insulated from the underlying second meander 24, form a second test structure 76 which comprises a first section 78 electrically connected between the fifth 64 and sixth 66 end contact terminals and a second section 80 electrically connected between the seventh 68 and eighth 70 end contact terminals. The fifth 65 and sixth 67 intermediate contact terminals are electrically connected to the ends of a first folded segment 73 of the first section 78 of the second test structure 76. The seventh 69 and eighth 71 intermediate contact terminals are electrically connected to the ends of a first folded segment 75 of the second section 80 of the second test structure 76. As can be seen from FIG. 1H and FIG. 5, the second test structure 76 is similar to the test structure set forth in the parent application; a significant difference being that a plurality of orthogonally positioned metal strips 34, of the first test structure 48 are disposed between the underlying second meander 24 and the overlying metal strips 62 of the preferred embodiment of the present invention depicted in FIGS. 1H and 5.

Although the individual test structures 48 and 76 are shown divided into two sections each in FIG. 5, each test structure could comprise a single section or could be divided into more than two sections depending upon the size of the test structure utilized and such is to be considered to be within the scope and contemplation of the present invention. A test pair is defined as a structure in which at least a portion of the set of electrically conductive strips of the second test structure, or of a section of the second test structure where it comprises two or more sections, overlies at least a portion of the set of electrically conductive strips of a corresponding first test structure or section thereof.

In the preferred embodiment depicted in FIG. 5, the test pairs are as follows. The first section 50 of the first test structure 48 and the first section 78 of the second test structure 76 since the electrically conductive strips 62 of the first section 78 overlie the electrically conductive strips 34 of the first section 50 in an area 200 enclosed by dashed lines in FIG. 5. The first section 50 of the first test structure 48 and the second section 80 of the second test structure 76 since the strips 62 of the second section 80 overlie the strips 34 of the first section 50 in an area 202 enclosed by dashed lines. The second section 52 of the first test structure 48 and the first section 78 of the second test structure 76 since the strips 62 of the first section 78 overlie the strips 34 of the second section 52 in an area 204 enclosed by dashed lines. Finally, the second section 52 of the first structure 48 and the second section 80 of the second test structure 76 since the strips 62 of the second section 80 overlie the strips 34 of the second section 52 in an area 206 enclosed by dashed lines.

Figure 6:
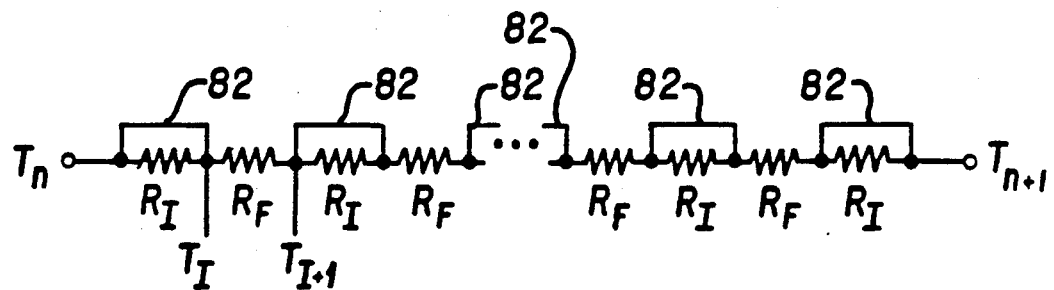
FIG. 6 is a schematic diagram of an exemplary portion of a representative test structure in accordance with a preferred embodiment of the present invention.

The apparatus for detecting vertically propagated defects in integrated circuits described above is utilized as follows. Referring to FIG. 6, there is shown a schematic of an equivalent circuit of a representative section of an exemplary test structure. $T_n$ represents an end contact terminal at one end of a section of a test structure (for example the first end contact terminal 36; the third end contact terminal 40; the fifth end contact terminal 64; or the seventh end contact terminal 68 as shown in FIG. 5). $T_{n+1}$ represents the end contact terminal at the other end of the section of the test structure (for example the second end contact terminal 38; the fourth end contact terminal 42; the sixth end contact terminal 66; or the eighth end contact terminal 70 see FIG. 5). $T_I$ represents an intermediate contact terminal of a test structure (for example the first 37, third 41, fifth 65 or seventh 69 intermediate contact terminal as shown in FIG. 5). $T_{I+1}$ represents another intermediate contact terminal of the test structure (for example the second 39, fourth 43, sixth 67 or eighth 71 intermediate contact terminal as shown in FIG. 5). $R_I$ represents the resistance of each intermediate segment between the terminals $T_n$ and $T_{n+1}$ (for example intermediate segment 16 of the first meander 14; or intermediate segment 26 of the second meander 24).

$R_F$ represents the resistance of each folded segment between the terminals $T_n$ and $T_{n+1}$ (for example folded segment 18 of the first meander 14; or folded segment 28 of the second meander 24). Note that in the embodiment shown, the resistance $R_F$ of a folded segment can be determined by measuring the resistance between the first and second intermediate contact terminals 37 and 39; the third and fourth intermediate contact terminals 41 and 43; the fifth and sixth intermediate contact terminals 65 and 67; and the seventh and eighth intermediate contact terminals 69 and 71. Note also that the resistance $R_F$ of a folded segment can also be determined by measuring the resistance between $T_n$ and $T_{I+1}$ as long as the metal strip connecting $T_n$ to the folded segment is intact. See, for example, FIG. 6 where the resistance between $T_n$ and $T_{I+1}$ is equal to $R_F$ since the metal strip, represented by short circuit 82, has shorted out the resistor $R_I$. Each intermediate segment is electrically shorted out by a metal strip (for example metal strip 3 of the first test structure 48; or metal strip 62 of the second test structure 76) which is electrically connected to each end of the intermediate segment. This is schematically represented in FIG. 6 by a short circuit 82 across each resistor $R_I$. The resistance $R_T$ between the terminals $T_n$ and $T_{n+1}$ equals $NR_F$ in a defect free test structure where N is equal to the number of folded segments between the terminals $T_n$ and $T_{n+1}$.

In the exemplary test structures depicted in FIG. 5, there are seven folded segments in each section of each test structure; that is, there are seven folded segments between the first 36 and second 38 end contact terminals; between the third 40 and fourth 42 end contact terminals; between the fifth 64 and sixth 66 end contact terminals; and between the seventh 68 and eighth 70 end contact terminals. Therefore, N=7 and $R_T=7R_F$ for each section of the exemplary test structures depicted in FIG. 5.

Assuming a defect in the metallization layer characterized by an absence of metal which causes an open circuit in two metal strips 62 of the first section 78 of the second test structure 76 depicted in FIG. 5, the resistance $R_T$ between the terminals $T_5$ and $T_6$ (end contact terminals 64 and 66) would be equal to $7R_F+2R_I$ since two of the short circuits 82 across two of the resistances $R_I$ are now open due to the open circuits in the corresponding metal strips 62.

Figure 7:
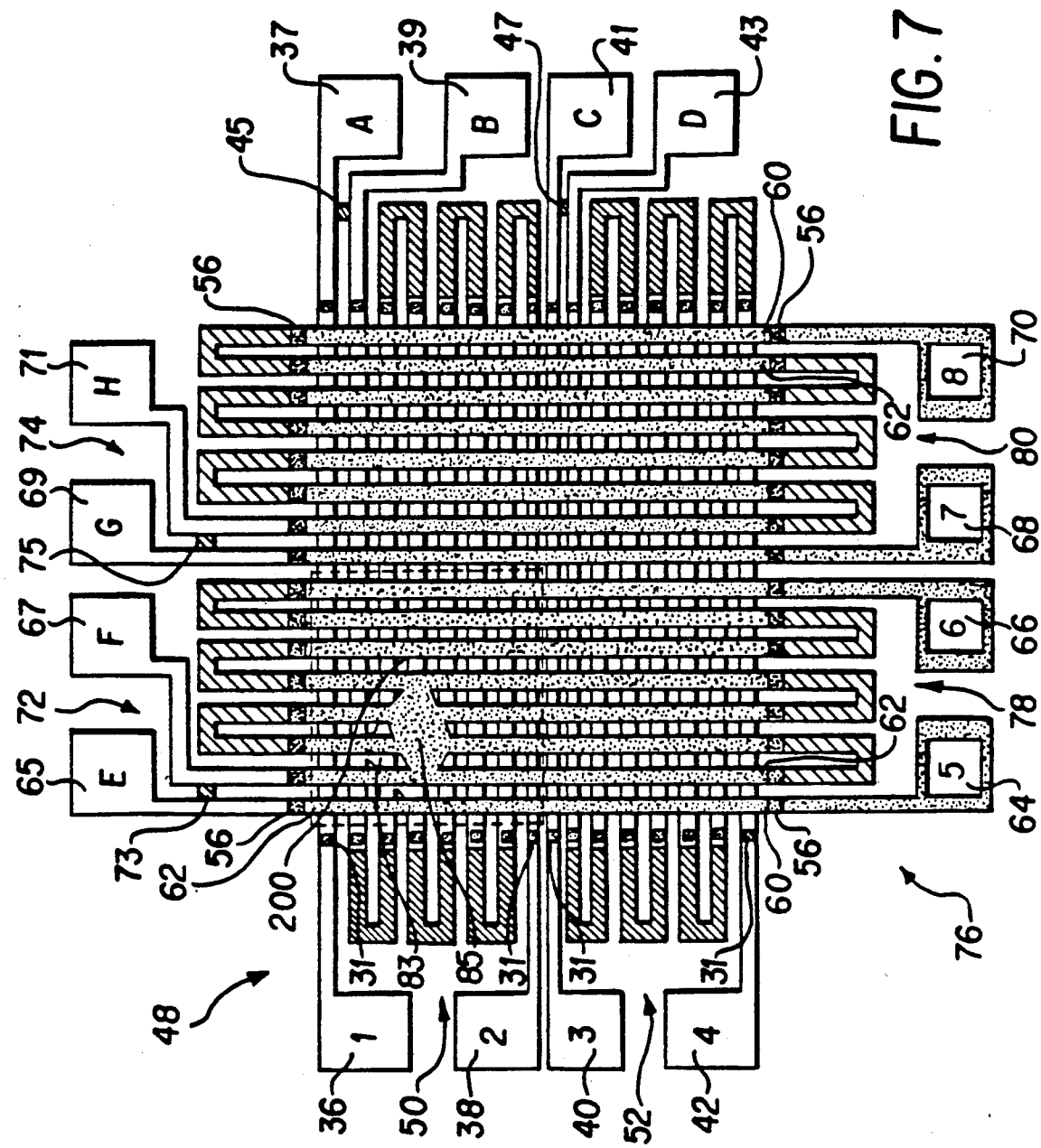
FIG. 7 is a diagrammatic plan view as depicted in FIG. 5 further illustrating a defect in a first test structure and a defect in a second test structure.

Referring now to FIG. 7 there are shown the two test structures 48 and 76 depicted in FIG. 5. In this example, it is assumed there is a defect 83 characterized by an excess of metal shorting together the second, third and fourth metallic strips 34 in the first section 50 of the first test structure 48; and a defect 85 characterized by an absence of metal causing a break in the third and fourth metal strips 62 of the first section 78 of the second test structure 76. These defects are shown schematically in FIG. 8.

The excess metal defect 83 which shorts the second, third, and fourth metal strips 34 in the first section 50 of the first test structure 48 is represented by a short circuit 84 which is connected between the short circuits 82 across the second, third and fourth resistances $R_I$ representing the second, third and fourth intermediate segments 16 of the first meander 14. As a result of the defect, the resistance $R_I$ between the terminals $T_1$ and $T_2$ (end contact terminals 36 and 38) of the first section 50 of the first test structure 48 is equal to $5R_F$ since the defect has shorted out the second and third folded segments 18 of the first meander 14, leaving five folded segments in the circuit between the first end contact terminal 36 ($T_1$) and the second end contact terminal 38 ($T_2$). Since the magnitude of $5R_F$ is less than the magnitude of $7R_F$, a defect is indicated as having occurred in the first section 50 of the first test structure 48.

The absence of metal defect 85 in the first section 78 of the second test structure 76 is represented by an opening in the short circuits 82 across the third and fourth resistances $R_I$ representing the third and fourth intermediate segments 26 of the second meander 24. As a result of the defect, the resistance $R_2$ between the terminals $T_5$ and $T_6$ (end contact terminals 64 and 66) of the first section 78 of the second test structure 76 is equal to $7R_F+2R_I$ because the defect has opened the short circuits across two of the intermediate segments 26 in the second meander 24. Since $7R_F+2R_I>7R_F$, a defect is indicated as having occurred in the first section 78 of the second test structure 76. Finally, since both defects occurred within a test pair, that is within the vertically adjacent first sections 50 and 78 of test structures 48 and 76, having metal strips 34 and 62 respectively which overlap at area 200, a vertical defect is considered to have occurred. Furthermore, it is considered to have occurred in the region defined by area 200.

Figure 9:
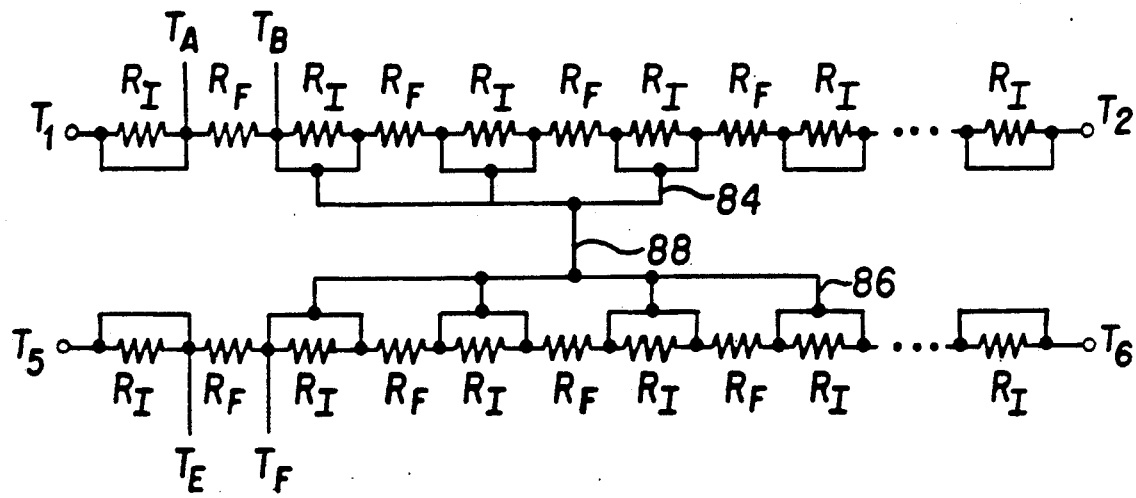
FIG. 9 is a schematic diagram setting forth the equivalent circuits of the test structures depicted in FIG. 7 with an excess metal in each test structure.

Referring to FIG. 9, it is assumed now that the defects 83 and 85 depicted in FIG. 7 are both excess metal defects. It is also assumed for this example that excess metal defect 83 shorts together the second, third and fourth metal strips 34 in the first section 50 of the first test structure 48; and that excess metal defect 85 shorts together the second, third, fourth and fifth metal strips 62 of the first section 78 of the second test structure 76. It is further assumed that the excess metal defects 83 and 85 are shorted to each other. This is schematically represented by a short circuit 88 which is connected between the short circuit 84 caused by the excess metal defect 83 in the first test structure 48 shorting the second, third and fourth metal strips 34 together; and the short circuit 86 caused by the excess metal defect 85 in the second test structure 76 shorting the second, third, fourth and fifth metal strips 62 together.

Because of the short circuit 88 between the first section 50 of the first test structure 48 and the first section 78 of the second test structure 76, there will be a finite resistance (that is a resistance R having a value less than that indicative of an open circuit) measurable between either the first end contact terminal 36 ($T_1$) or the second end contact terminal 38 ($T_2$) of the first section 50, of the first test structure 48 and either the fifth end contact terminal 64 ($T_5$) or the sixth end contact terminal 66 ($T_6$) of the first section 78 of the second test structure 76.

As shown in FIG. 9, the resistance between the first end contact terminal $T_1$ and the fifth end contact terminal $T_5$ is equal to $2R_F$ since there are two folded segments remaining in the $T_1$-$T_5$ circuit. The resistance $R_T$ between the first end contact terminal $T_1$ and the sixth end contact terminal $T_6$ is equal to $4R_F$ since there are four folded segments remaining in the $T_1$-$T_6$ circuit (note: three of the seven $R_F$ resistances representing the seven intermediate segments of each section depicted in the exemplary structure of FIGS. 5 and 7 have been omitted from the schematic of FIGS. 8 and 9 for clarity). The resistance $R_T$ between the second end contact terminal $T_2$ and the fifth end contact terminal $T_5$ is equal to $5R_F$; and the resistance between the second end contact terminal $T_2$ and the sixth end contact terminal $T_6$ is equal to $7R_F$.

Figure 8:
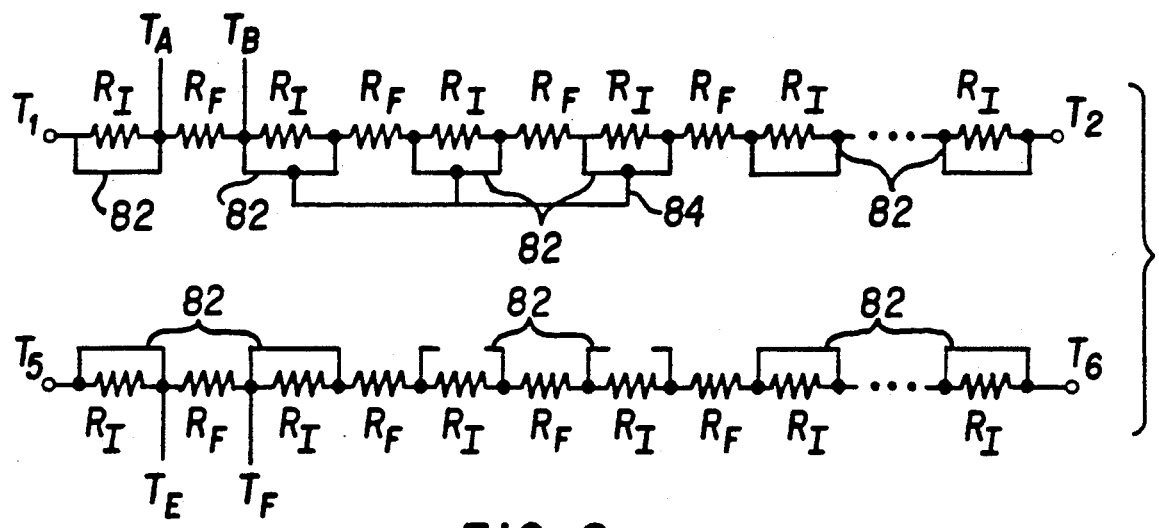
FIG. 8 is a schematic diagram setting forth the equivalent circuits of the test structures depicted in FIG. 7 with an open circuit defect in each test structure.

As a result of the excess metal defect 83, the resistance $R_1$ between the terminals $T_1$ and $T_2$ (end contact terminals 36 and 38) of the first section 50 of the first test structure 48 is equal to $5R_F$ as previously described with respect to FIG. 8. Once again, since $5R_F$ is less than $7R_F$, a defect is indicated as having occurred in the first section 50 of the first test structure 48. Furthermore, as a result of the excess metal defect 85, the resistance $R_2$ between the terminals $T_5$ and $T_6$ (end contact terminals 64 and 66) of the first section 78 of the second test structure 76 is equal to $4R_F$ because the defect has shorted out three of the seven folded segments 28 in the second meander 24. Since $4R_F$ is less than $7R_F$ a defect is indicated as having occurred in the first section 78 of the second test structure 76. Since, in this example, both defects occur within a test pair, that is within the vertically adjacent first sections 50 and 78 of test struction 48 and 76, having metal strips 34 and 62 respectively which overlap at area 200, a vertical defect is considered to have occurred. Furthermore, it is considered to have occurred in the region defined by area 200.

Each individual test structure 48 and 76 can be utilized to determine the size and distribution of spot defects and can also be utilized to determine the density of such defects in accordance with the procedures described in the parent of the present application which application has been incorporated by reference into this detailed description as if fully set forth herein. In addition, use of the vertical test structure described herein will also enable the determination and size distribution of vertically propagated defects as well as the density of such defects. Such determinations can be consistently and accurately made on the test die incorporating the structure of the present invention; and, since the test die has undergone the same processing as the integrated circuit semiconductor device, such determinations can be attributed to the integrated circuit devices even though such devices do not exhibit actual functional failures.

Figure 10:
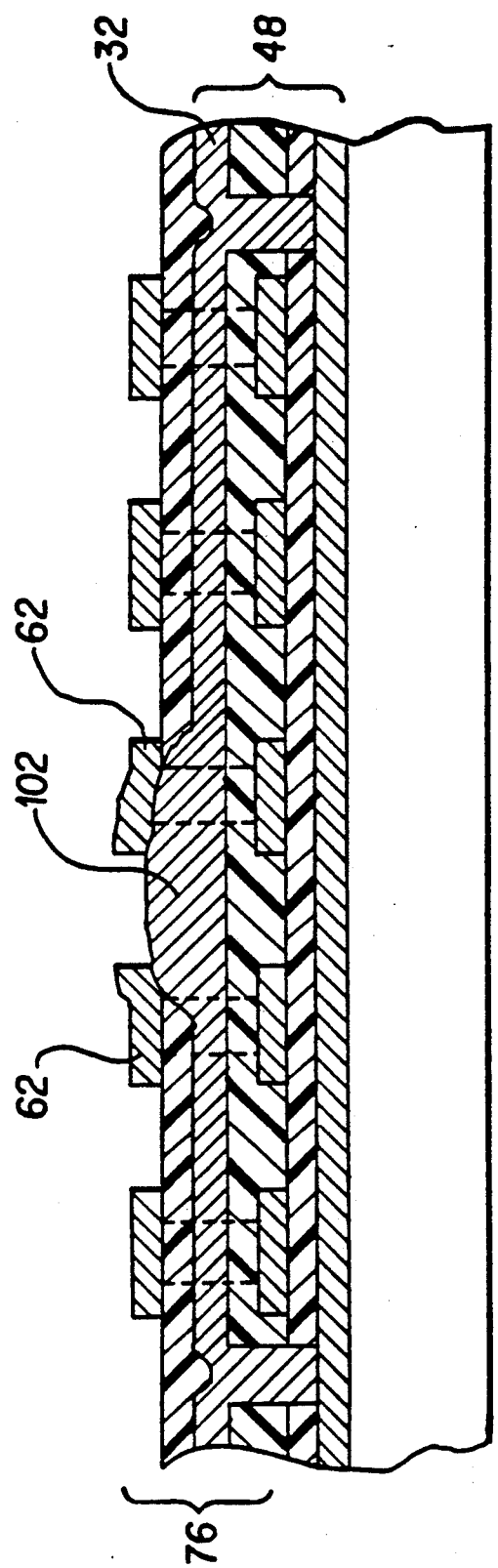
FIG. 10 is a diagrammatic cross-sectional representation of a vertical double bridge test structure containing an exemplary three dimensional defect.

Referring now to FIG. 10 there is shown a diagrammatic cross-sectional representation of a vertical double bridge test structure comprising a first (lower in this depiction) test structure 48 and a second (upper) test structure 76. These test structures form a test pair since at least a portion of the set of electrically conductive strips 62 of the upper test structure 76 overlie at least a portion of the set of electrically conductive strips 32 of the lower test structure 48. FIG. 10 is substantially the same diagrammatic cross-section as previously depicted in FIG. 1H except that FIG. 10 also includes a vertical defect 102 which is shown in exemplary form for purposes of this description.

For this example, it is assumed for purposes of illustration that the vertical defect 102 is an excess metal defect which shorts out two adjacent metal strips 62 of the upper test structure 76 and four adjacent metal strips 32 in the lower test structure 48. As previously described, a vertical defect is any defect which causes a planar defect in the form of an open or short circuit in each test structure of a test pair. In other words, detection of a planar defect, in accordance the procedures previously set forth in the parent application Ser. No. 011,729, in one test structure of a test pair; and detection of a planar defect, in accordance with the same procedures, in the other test structure of the test pair, is an indication of vertical defect.

The vertical defect could comprise an open circuit planar defect in one test structure of a test pair and a short circuit planar defect in the other test structure of the test pair; a short circuit planar defect in the one test structure and an open circuit planar defect in the other test structure; short circuit planar defects in both the one test structure and the other test structure; and open circuit planar defects in both the one test structure and the other test structure; so long as the planar defects occur in both test structures of a test pair.

A vertical defect, as defined herein, also includes an electrically conductive defect which shorts one metal strip in one test structure of a test pair to one metal strip in the other test structure of the test pair; two or more metal strips in the one test structure to one metal strip in the other test structure; one metal strip in the one structure to two or more metal strips in the other test structure; at least one metal strip in the one test structure to at least one metal strip in the other test structure and which further causes a short circuit to at least one metal strip in one or more test structures vertically adjacent to the test pair; etc. Therefore, vertical defects also include those types of defects which, while not necessarily causing a planar defect, will cause a short circuit between vertically adjacent test structures.

In the present example, the vertical defect 102 is assumed to short out two adjacent metal strips in the upper test structure, and four adjacent metal strips in the lower test structure. Accordingly, FIG. 10 depicts the defect 102 as extending between and electrically contacting adjacent metal strips 62 of the upper test structure 76; and because the section depicted in FIG. 10 is taken parallel to the metal strips 32 in the lower test structure 48, the defect extends into and out of the cross-section of FIG. 10, extending between and electrically connecting four adjacent metal strips 32 in the lower test structure 48.

The detection of the vertical defect 102 and the determination of its size is preferably performed as follows.

Since the defect 102 in the present example shorts out two adjacent metal strips 62 in the upper test structure 76 and four adjacent metal strips 32 in the lower test structure 48, the defect 102 will be detected as a planar defect in the lower test structure 48 and also as a planar defect in the upper test structure 76 in accordance with the procedure for detecting planar defects set forth in the parent application Ser. No. 011,729 which application has previously been incorporated, in its entirety, into the present application by reference. Since the upper 76 and the lower 48 test structures form a test pair, detection of a planar defect in each of these test structures will be considered as an indication of the presence of a vertical defect in the area of overlap of the electrically conductive strips as previously described. The planar size of the defect in each test structure will be determined in accordance with the procedure also set forth in the parent application.

The size of the vertical defect 102 is determined by taking the average of the planar defect size determinations made in each of the upper and lower test structures in accordance with the procedures set forth in the parent application which has been incorporated herein by reference. For example, if the planar size determinations indicate the defect as having a diameter $D_1$ in the lower test structure and as having a diameter $D_2$ in the upper test structure, the vertical defect size will be indicated as $$\frac{D_1 + D_2}{2}.$$

It should be noted that since a vertical defect must be large enough to extend between adjacent test structures, each vertical defect will have a minimum size which is equal to at least the distance between the metal strip or strips in the one test structure and the metal strip or strips in the vertically adjacent test structure. This consideration becomes particularly important in those cases where a vertical defect shorts only one metal strip in one test structure to only one metal strip in the vertically adjacent test structure and the width of the spacing between adjacent metal strips within each test structure is less than the distance between the metal strips in the vertically adjacent test structures. In such a case, planar defects within each test structure do not exist and therefore do not have a determinable size even though a vertical defect had been detected.

The size distribution and density of vertically propagated defects are shown in histogram form in FIG. 11. FIG. 11A is a histogram of the number of spot defects occurring in layer i as a function of the radius of such defects. FIG. 11A also shows the effect on this distribution of defects occurring in layer i-1, which is the layer immediately underlying layer i. The distribution of three dimensional defects arising from layer i-1 is shown in the histogram of FIG. 11D.

FIG. 11C is a histogram of the distribution of spot defects in layer i caused by vertical defects arising from layer i-2; that is, the second layer underlying layer i. Likewise, FIG. 11B is a histogram of the distribution of spot defects in layer i caused by vertical defects arising from layer i-3; that is, the third layer beneath layer i.

FIG. 11E is a histogram of the distribution of spot defects in layer i caused by the cumulative effects of vertical defects arising in layers i-1, i-2 and i-3 as well as the spot defects occurring in layer i itself. The effective height of each bar of the histogram of FIG. 11E is determined by the equation $$h_i^{k,eff} = h_i^k + h_{i-1}^k \alpha_{i-1}^k + h_{i-2}^k \alpha_{i-2}^k + \ldots$$

and the distribution is calculated by the equation:

$$Y = \pi \overset{n}{\underset{i=1}{e}} {}^{-\sum\limits_{j=1}^{k} h_i^{k,eff} A_{i} \alpha(R_j^i)}$$

Figure 12A:
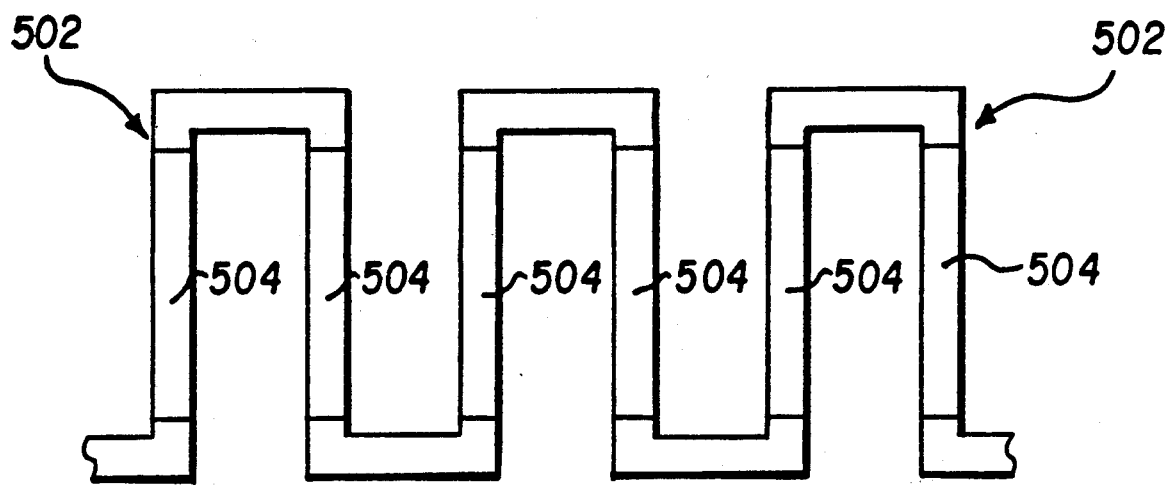
FIG. 12A depicts a portion, in diagrammatic plan view, of one type of test structure of a set of test structures in accordance with an alternate embodiment of the present invention.
Figure 12B:
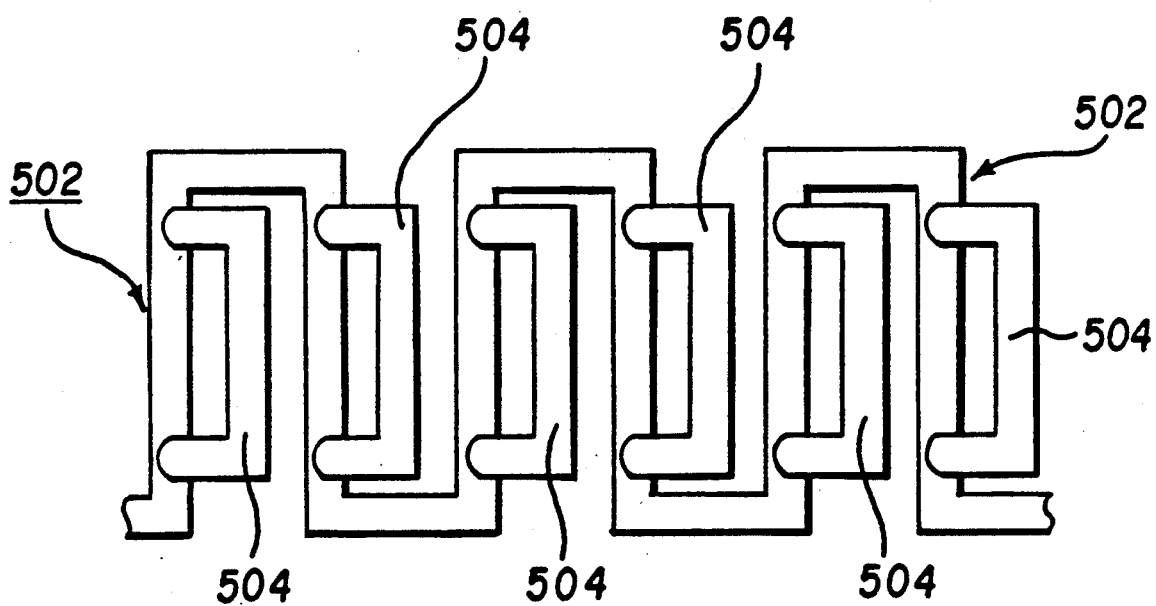
FIG. 12B depicts a portion, in diagrammatic plan view, of a second type of test structure of the set of test structures in accordance with the alternate embodiment of the present invention.

By using an alternate embodiment of the present invention, it is possible to determine whether a defect is attributable to the formation of the metallization (conductive strips) layer or is attributable to the formation of the polycrystalline (meander) layer under the metallization layer. In this embodiment there is at least one set of two types of tests structures disposed on the wafer. Each type of test structure comprises a meander 502 and an associated set of conductive strips 504. However, in one test structure type the conductive strips 504 overlie the meander 502 (see, for example, the embodiment, a portion of which is depicted in plan view in FIG. 12A). In the other type of test structure, the conductive strips 504 do not overlie the meander 502 (see, for example, the embodiment a portion of which is depicted in plan view in FIG. 12B).

Assume defects occur during the formation of the polycrystalline meander and that these defects propagate upward into the metallization (conductive strip) level. In this case, the yield rates in the type of structure depicted in FIG. 12A will be lower than the yield rates in the type of structure depicted in FIG. 12B. This is because the defects in the polycrystalline layer have propagated into the metallization layer causing breaks in the overlying conductive strips in the structure depicted in the FIG. 12A. However, such defects will not tend to cause breaks in the conductive strips of the structure depicted in FIG. 12B because the strips do not overlie the meander.

Assume defects occur during the formation of the conductive strips. In this case the yield rates in the structures depicted in FIGS. 12A and 12B will be substantially equal and lower than that expected for defect-free processing. This is because the defects have occurred in the metallization layer and will be substantially evenly distributed over both types of structures. Consequently, by using this alternate embodiment of the present invention, it is possible to determine the source of the defect; that is whether they are occurring during the polycrystalline or during the metallization processing steps.

It will be understood that various changes in the details, materials, and arrangements of the part which have been described and illustrated in order to explain the nature of this invention, may be made by those skilled in the art without departing from the principal and scope of the invention as expressed in the following claims.

We claim:

1. An apparatus for detecting defects arising as a result of integrated circuit processing, said apparatus comprising:

(a) a substrate;

(b) a first meander formed on or in said substrate, said first meander comprising a high electrical resistivity material having a predetermined number of intermediate segments, the ends of which are interconnected by folded segments such that an electrical circuit, having an predetermined electrical resistance, is formed between the ends of the first meander;

(c) a second meander electrically insulated from said first meander, said second meander comprising a high electrical resistivity material having a predetermined number of intermediate segments, the ends of which are interconnected by folded segments such that an electrical circuit, having a predetermined electrical resistance, is formed between the ends of the second meander;

(d) a first set of strips comprising a predetermined number of strips of high electrical conductivity material, electrically insulated from said first and second meanders, the ends of each strip being electrically connected to the ends of a corresponding intermediate segment of said first meander; and (e) a second set of strips comprising a predetermined number of strips of high electrical conductivity material which are electrically insulated from said first set of strips, said first meander and said second meander, the ends of each strip of said second set being electrically connected to the ends of a corresponding intermediate segment of said second meander, and a least a portion of said second set of strips overlying a least a portion of said first set of strips.

2. The apparatus in accordance with claim 1 additionally comprising:

(f) a first end contact terminal electrically connected to one end of said first meander, a second end contact terminal electrically connected to the other end of said first meander, and a first intermediate contact terminal electrically connected to an end of an intermediate segment of said first meander such that the portion of the first meander between said first intermediate contact terminal and an end contact terminal of said first meander includes at least one intermediate segment; and (g) a first end contact terminal electrically connected to one end of said second meander, a second end contact terminal electrically connected to the other end of said second meander and at least one intermediate contact terminal electrically connected to one end of an intermediate segment of said second meander such that the portion of the second meander between the intermediate contact terminal and an end contact terminal of said second meander includes at least one intermediate segment.

3. The apparatus in accordance with claim 2 wherein each meander comprises at least two sections, each section having a first end contact terminal electrically connected to one end thereof; a second end contact terminal electrically connected to the other end thereof; and two intermediate contact terminals electrically connected to the ends of two intermediate segments such that the portion of the meander segment between one of said intermediate contact terminals and an end contact terminal includes at least one intermediate segment; and the portion of the meander segment between the two intermediate contact terminals includes a folded segment.

4. The apparatus in accordance with claim 3 wherein the intermediate segments of said second meander are oriented substantially orthogonally with respect to the intermediate segments of said first meander.

5. The apparatus in accordance with claim 4 wherein each strip of the first set of strips is in substantial overlying alignment with a corresponding one of each intermediate segments of said first meander.

6. The apparatus in accordance with claim 5 wherein each strip of the second set of strips is in substantial overlying alignment with a corresponding one of each of said intermediate segments of said second meander.

7. The apparatus in accordance with claim 6 wherein said first meander is formed of doped single crystal silicon.

8. The apparatus in accordance with claim 7 wherein said second meander is formed of doped polycrystalline silicon.

9. The apparatus in accordance with claim 8 wherein said strips are formed of metal.

10. The apparatus in accordance with claim 9 wherein said metal comprises aluminum.

11. The apparatus in accordance with claim 6 wherein said first meander is formed of doped polycrystalline silicon.

12. An apparatus for detecting defects arising as a result of integrated circuit processing, said apparatus comprising;

(a) a substrate;

(b) a first meander formed on substrate, said first meander comprising high electrical resistivity material having predetermined number of intermediate segments, the ends of which are interconnected by folded segments such that an electrical circuit, having a predetermined electrical resistance, is formed between the ends of the first meander;

(c) a second meander disposed over and electrically insulated from said first meander, said second meander comprising a high electrical resistivity material having a predetermined number of intermediate segments, which are oriented substantially orthogonally with respect to the intermediate segments of said first meander, the ends of the intermediate segment of said second meander being interconnected by folded segments such that an electrical circuit, having a predetermined electrical resistance, is formed between the ends of the second meander;

(d) a first set of strips comprising a predetermined number of strips of high electrical conductivity material, electrically insulated from said first and second meanders, each strip being in substantial overlying alignment with a corresponding one of each of said intermediate segments of said first meander and the ends of each strip being electrically connected to the ends of said corresponding intermediate segment of said first meander;

(e) a second set of strips comprising a predetermined number of strips of high electrical conductivity material which are electrically insulated from said first set of strips, said first meander and said second meander, each strip of said second set being in substantial overlying alignment with a corresponding one of each of said intermediate segments of said second meander and the ends of each strip of said second set being electrically connected to the ends of said corresponding intermediate segments of said second meander;

(f) a first end contact terminal electrically connected to one end of said first meander, a second end contact terminal electrically connected to the other end of said first meander, a first intermediate contact terminal electrically connected to an end of an intermediate segment of said first meander such that the portion of the first meander between said first intermediate contact terminal and an end contact terminal of said first meander includes one intermediate segment, and a second intermediate contact terminal electrically connected to the end of a second intermediate segment of said first meander such that the portion of the first meander between said first and second intermediate contact terminals includes a folded segment; and (g) a first end contact terminal electrically connected to one end of said second meander, a second end contact terminal electrically connected to the other end of said second meander, a first intermediate contact terminal electrically connected to one end of an intermediate segment of said second meander such that the portion of the second meander between the first intermediate contact terminal and an end contact terminal of said second meander includes one intermediate segment, and a second intermediate contact terminal electrically connected to one end of a second intermediate segment of said second meander such that the portion of the second meander between the first and second intermediate contact terminals of said second meander includes one folded segment of said second meander.

13. The apparatus in accordance with claim 12 wherein said apparatus is replicated at predetermined locations on a semiconductor wafer.

14. A method for detecting defects arising as a result of processing integrated circuits, said method comprising steps of:

(a) forming a first meander on or in a substrate, said first meander comprising a high electrical resistivity material having a predetermined number of intermediate segments, the ends of which are interconnected by folded segments such that an electrical circuit, having a predetermined electrical resistance, is formed between the ends of the first meander;

(b) forming a second meander electrically insulated from said first meander, said second meander comprising a high electrical resistivity material having predetermined number of intermediate segments, the ends of which are interconnected by folded segments such that an electrical circuit, having a predetermined electrical resistance, is formed between the ends of the second meander;

(c) forming a first set of strips comprising a predetermined number of strips of high electrical conductivity material, electrically insulated from said first and second meanders, the ends of each strip being electrically connected to the ends of a corresponding intermediate segment of said first meander whereby an electrical circuit having a resistance $R_{M1}$ is formed between the ends of said first meander;

(d) forming a second set of strips comprising a predetermined number of strips of high electrical conductivity material which are electrically insulated from said first set of strips, said first meander and said second meander, the ends of each strip of said second set being electrically connected to the ends of a corresponding intermediate segment of said second meander whereby an electrical circuit having a resistance $R_{M2}$ is formed between the ends of said second meander, and at least a portion of said second set of strips overlies at least a portion of said first set of strips;

(e) forming a first end contact terminal electrically connected to one end of said first meander, and a second end contact terminal electrically connected to the other end of said first meander;

(f) forming a first end contact terminal electrically connected to one end of said second meander, and a second end contact terminal electrically connected to the other end of said second meander;

(g) measuring the electrical resistance $R_1$ between the first and second end contact terminals of said first meander and the electrical resistance $R_2$ between the first and second end contact terminals of said second meander; and (h) providing an indication of:
  (i) no defects where the magnitude of the resistance $R_1$ is substantially equal to $R_{M1}$ and the magnitude of $R_2$ is substantially equal to $R_{M2}$;
  (ii) the presence of a vertically propogated defect where the magnitude of the resistance $R_1$ is not substantially equal to $R_{M1}$ and the magnitude of the resistance $R_2$ is not substantially equal to $R_{M2}$.

15. An apparatus for detecting defects arising as a result of integrated circuit processing, said apparatus comprising at least one set of test structures on a substrate, said set (a) a first test structure comprising:
  (i) a first meander formed on or in said substrate, said first meander comprising a high electrical resistivity material having a predetermined number of intermediate segments, the ends of which are interconnected by folded segments such that an electrical circuit, having a predetermined electrical resistance, is formed between the ends of the first meander;
  (ii) a first set of strips comprising a predetermined number of strips of high electrical conductivity material, electrically insulated from and positioned in substantially non-overlying spaced relationship with respect to said first meander, the ends of each strip being electrically connected to the ends of a corresponding intermediate segment of said first meander; and (b) a second test structure comprising:
  (i) a second meander formed on or in said substrate, said second meander comprising a high electrical resistivity material having a predetermined number of intermediate segments, the ends of which are interconnected by folded segments such that an electrical circuit, having a predetermined electrical resistance, is formed between the ends of the second meander; and
  (ii) a second set of strips comprising a predetermined number of strips of high electrical conductivity material, electrically insulated from said second meander, each strip being in substantial overlying alignment with a corresponding one of each of said intermediate segments of said second meander and the ends of each strip being electrically connected to the ends of the corresponding intermediate segment of said second meander.

16. The apparatus in accordance with claim 15 additionally comprising a first end contact terminal electrically connected to one end of said first meander; a second end contact terminal electrically connected to the other end of said first meander; a third end contact terminal electrically connected to one end of said second meander; and a fourth end connect terminal electrically connected to the other end of said second meander.

17. The apparatus in accordance with claim 16 comprising a plurality of said sets of test structures on said substrate.

18. The apparatus in accordance with claim 17 wherein said first meander is formed of doped single crystal silicon.

19. The apparatus in accordance with claim 18 wherein said strips are formed of metal.

20. The apparatus in accordance with claim 19 wherein said metal comprises aluminum.

21. The apparatus in accordance with claim 17 wherein said first meander is formed of doped polycrystalline silicon.

22. A method for detecting defects arising as a result of processing integrated circuits, said method comprising the steps of:
(a) providing at least one set of test structures on a substrate, said set comprising:
(i) a first test structure comprising a first meander on or in said substrate, said first meander comprising a high electrical resistivity material having a predetermined number of intermediate segments, the ends of which are interconnected by folded segments such that a electrical circuit, having a predetermined electrical resistance, is formed between the ends of the first meander; and a first set of strips comprising a predetermined number of strips of high electrical conductivity material, electrically insulated from and positioned in substantially non-overlying spaced relationship with respect to said first meander, the ends of each strip being electrically connected to the ends of a corresponding intermediate segment of said first meander whereby an electrical circuit having a resistance $R_{M1}$ is formed between the ends of said first meander; and
(ii) a second test structure comprising a second meander formed on or in said substrate, said second meander comprising a high electrical resistivity material having a predetermined number of intermediate segments, the ends of which are interconnected by folded segments such that an electrical circuit, having a predetermined electrical resistance, is formed between the ends of the second meander; and a second set of strips comprising a predetermined number of strips of high electrical conductivity material, electrically insulated from said second meander, each strip being in substantial overlying alignment with a corresponding one of each of said intermediate segments of said second meander and the ends of each strip being electrically connected to the ends of the corresponding intermediate segment of said second meander whereby an electrical circuit having a resistance $R_{M2}$ is formed between the ends of said second meander;
(b) providing a first end contact terminal electrically connected to one end of said first meander, and a second end contact terminal electrically connected to the other end of said first meander;
(c) providing a first end contact terminal electrically connected to one end of said second meander, and a second end contact terminal electrically connected to the other end of said second meander;
(d) measuring the electrical resistance $R_1$ between the first and second end contact terminals of said first meander and the electrical resistance $R_2$ between the first and second end contact terminals of said second meander; and
(e) providing an indication of:
(i) no defects where the magnitude of $R_1$ is substantially equal to $R_{M1}$ and the magnitude of $R_2$ is substantially equal to $R_{M2}$
(ii) the presence of a defect attributable to meander processing where the magnitude of the resistance $R_1$ is substantially equal to $R_{M1}$ and the magnitude of $R_2$ is not substantially equal to $R_{M2}$; and
(iii) a defect attributable to strip metallization processing where the magnitude of the resistance $R_1$ is not substantially equal to $R_{M1}$ and the magnitude of the resistance $R_2$ is not substantially equal to $R_{M2}$.

* * * * *

UNITED STATES PATENT AND TRADEMARK OFFICE
CERTIFICATE OF CORRECTION

PATENT NO. : 5,051,690

DATED : September 24, 1991

INVENTOR(S) : Wojciech Maly and Michael E. Thomas

It is certified that error appears in the above-identified patent and that said Letters Patent is hereby corrected as shown below:

Column 14, lines 3-4, the formula "$h_i^{k,eff} = h_i^k + h_{i-1}^k \alpha_{i-1}^k + h_{i-2}^k \alpha_{i-2}^k + \ldots$" should be corrected to read --$h_i^{k,eff} = h_i^k + h_{i-1}^k \alpha_{i-1}^k + h_{i-2}^k \alpha_{i-2}^k + \ldots$--

Column 18, line 29 (line 4 of claim 15), the word "comprising" should appear after the words "said set".

Signed and Sealed this

Eighth Day of June, 1993

*Attest:*

MICHAEL K. KIRK

*Attesting Officer*    *Acting Commissioner of Patents and Trademarks*